(12) United States Patent
Dixit et al.

(10) Patent No.: US 6,608,335 B2
(45) Date of Patent: *Aug. 19, 2003

(54) GROUNDED FILL IN A LARGE SCALE INTEGRATED CIRCUIT

(75) Inventors: Pankaj Dixit, Mountain View, CA (US); Timothy Horel, Mountain View, CA (US); Mu-Jing Li, Sunnyvale, CA (US); Ward Vercruysse, San Jose, CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,919
(22) Filed: May 25, 2000
(65) Prior Publication Data
US 2002/0185664 A1 Dec. 12, 2002

(51) Int. Cl.[7] .............................................. H01L 27/10
(52) U.S. Cl. ........................ 257/211; 257/207; 257/758
(58) Field of Search ................................ 257/207, 211, 257/208, 758

(56) References Cited

U.S. PATENT DOCUMENTS

| | | | | | |
|---|---|---|---|---|---|
| 4,916,514 A | * | 4/1990 | Nowak | ......................... | 357/68 |
| 4,962,058 A | * | 10/1990 | Cronin et al. | ................ | 437/187 |
| 5,441,915 A | * | 8/1995 | Lee | .............................. | 257/211 |
| 5,949,098 A | * | 9/1999 | Mori | ........................... | 257/207 |
| 5,986,294 A | * | 11/1999 | Miki et al. | ................... | 257/207 |
| 6,175,145 B1 | * | 1/2001 | Lee et al. | .................... | 257/529 |
| 2002/0084526 A1 | * | 7/2002 | Kasai | .......................... | 257/758 |

OTHER PUBLICATIONS

Stine, et al., "The Physical and Electrical Effects of Metal-Fill Patterning Practices for Oxide Chemical-Mechanical Polishing Processes", Mar. 1998, IEEE Transactions on Electron Devices, vol. 45, No. 3, pp. 665-679.

* cited by examiner

Primary Examiner—Phat X. Cao
(74) Attorney, Agent, or Firm—Thelen Reid & Priest LLP (57) ABSTRACT

An integrated circuit has a plurality of metal layers separated by a plurality of insulating layers. The integrated circuit comprises a pair of conductors on a first metal layer; at least one conductive fill element disposed between the conductors; and a via connecting the fill element to a ground contact on a metal layer adjacent to said first metal layer, where the via is formed of a conductive material.

18 Claims, 9 Drawing Sheets

GROUNDED FILL IN A LARGE SCALE INTEGRATED CIRCUIT

This application is related to the U.S. patent application Ser. No. 09/579,109 filed on May 25, 2000 and entitled A COMPUTER AIDED DESIGN FLOW TO LOCATE GROUNDED FILL IN A LARGE SCALE INTEGRATED CIRCUIT with named inventors Mu-Jing Li, Ward Vercruysse, Pankaj Dixit and Timothy Horel and assigned to Sun Microsystems, Inc.

BACKGROUND OF THE INVENTION

1. Field of the Invention

The present invention relates to integrated circuits. More particularly, the present invention relates to integrated circuits having grounded fill elements.

2. Background

Large scale central processing unit (CPU) integrated circuit computer chips increasingly contain more transistors and more metal layers. At the same time, the feature size of wires and other chip components is getting smaller as the enabling technologies improve. Because of increased chip complexity, chip designers and manufacturers are encountering challenges that they did not have to address in the design and manufacture of less complex chips.

Figure 1:
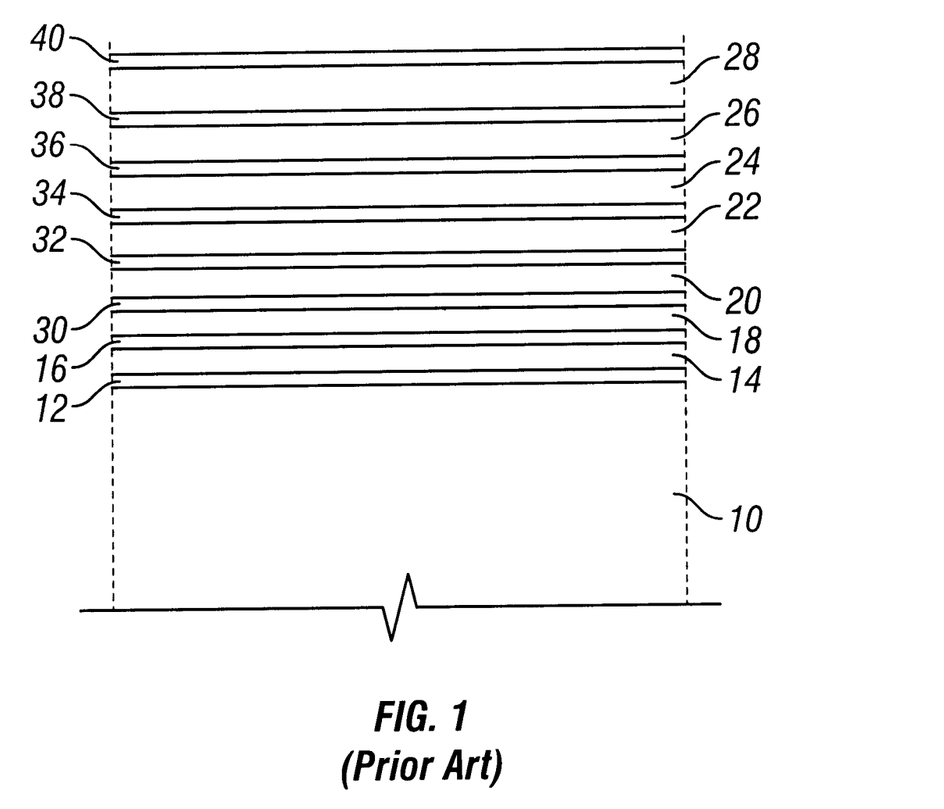
FIG. 1 is a cross-section diagram showing an integrated circuit chip having seven metal layers in accordance with the prior art.

FIG. 1 is a cross-section diagram showing an integrated circuit chip having seven metal layers in accordance with the prior art (not to scale). The chip includes a wafer (10). A dielectric layer (12) is formed on the wafer. The first metal layer, or metal 1 (14) is deposited next. Metal 2 (18), metal 3 (20), metal 4 (22), metal 5 (24), metal 6 (26) and metal 7 (28) are successively deposited. Dielectric layers (16, 30, 32, 34, 36, 38, 40) separate the metals. The chips are grown from the wafer on up. Therefore, for example, it can be said that metal 4 (22) is the upper adjacent layer to metal 3 (20) and that metal 2 (18) is the lower adjacent layer to metal 3 (20). Each metal layer contains etched wires including conductors (at $V_{dd}$) and ground wires (at $V_{ss}$). Generally, the metal layers are thicker at the top of the chip.

Integrated circuit chips require multilayer interconnects to connect various transistors to complete a circuit. In the metal layers of an IC chip, there are some areas with high interconnect density and others with low density. Due to this variation in density, the dielectric layer in aluminum and the copper layer in a copper interconnect scheme can be excessively polished in low density areas during the chemical mechanical polishing (CMP) process. In order to avoid this issue, dummy metal is inserted in the design to make the interconnect density in a layer uniform.

When dummy metal is included in a chip design without further consideration, it will be electrically floating and will capacitively couple with the signal lines above and below. It would therefore be desirable to connect dummy metal to ground, thereby avoiding unwanted noise in the chip.

Computer Aided Design (CAD) is used extensively in the design of computer chips. Many CAD tools are commercially available. However, commercially available CAD tools suffer from limitations of memory and processing speed, so that optimal design of grounded fills in a chip is not possible by merely using off-the-shelf CAD tools.

It is therefore desirable to improve on existing CAD tools to allow for better design of grounded fills within a large scale integrated circuit chip. Such improved CAD tools and systems result in integrated circuits not achievable using previous technologies.

BRIEF DESCRIPTION OF THE INVENTION

An integrated circuit has a plurality of metal layers separated by a plurality of insulating layers. The integrated circuit comprises a pair of conductors on a first metal layer; at least one conductive fill element disposed between the conductors; and a via connecting the fill element to a ground contact on a metal layer adjacent to said first metal layer, where the via is formed of a conductive material.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

One object of the invention is to enable the design and fabrication of chips having grounded fill elements within metal layers. These grounded fill elements, sometimes referred to as dummy metal, fill metal, or fill material, are designed into the chip so that they are formed along with the circuitry of the metal layers. Such fill material is not immediately essential to the circuitry of the chip. It is convenient to provide the fill elements from the same material that is provided for the circuitry in the metal layer. The fill elements serve two main purposes. First, they allow higher chip yields after polishing of the metal layers. Second, when the fill elements are properly designed and grounded, they reduce cross-talk or noise between conducting wires in the chip.

A CAD program has been developed to connect fill elements with ground areas in a metal layer above and/or below using vias. If no connections are available in adjacent metal layers, then a fill element may be connected to a ground area in the same layer using a strap.

Figure 2A:
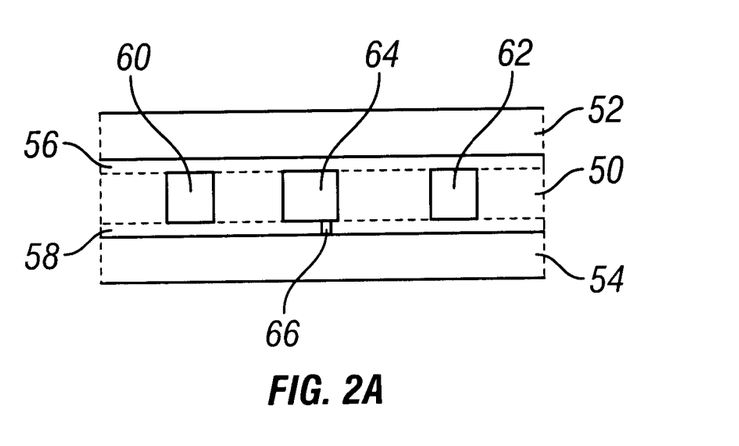
FIG. 2A is a cross-section diagram of a chip showing three metal layers in accordance with an embodiment of the present invention.
Figure 2B:
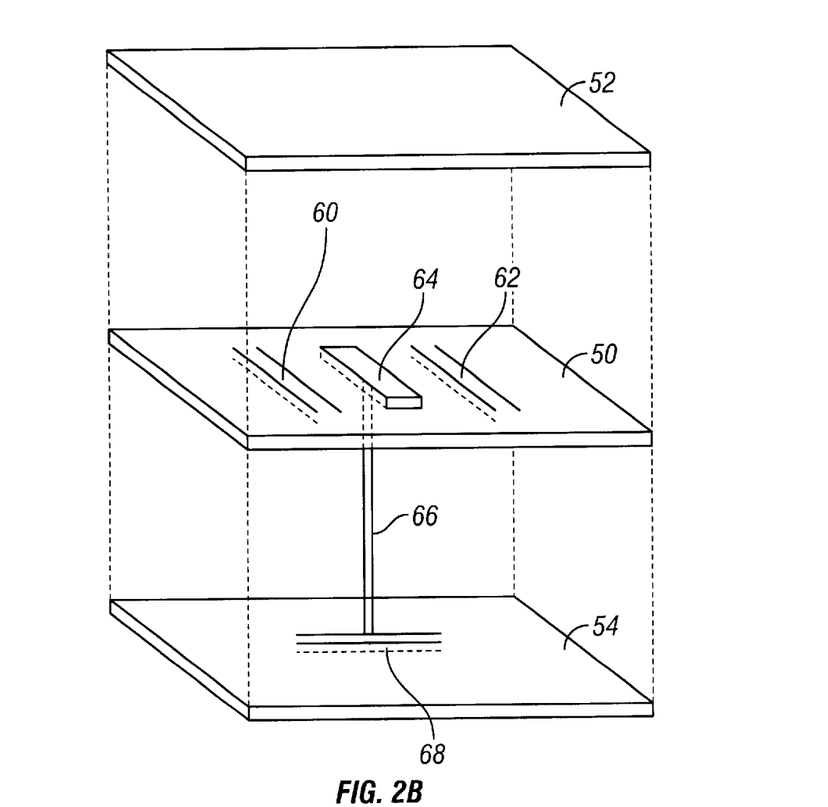
FIG. 2B is an expanded perspective diagram of a chip showing the same three metal layers shown in FIG. 2A.

A chip having a grounded fill element is illustrated in FIGS. 2A and 2B. FIG. 2A is a cross-section diagram of a chip showing three metal layers in accordance with an embodiment of the present invention. FIG. 2B is an expanded perspective diagram of a chip showing the same three metal layers shown in FIG. 2A. A metal layer (50) has an upper adjacent metal layer (52) and a lower adjacent metal layer (54). The metal layers are separated by dielectric layers (56,58). The dielectric layers are not shown in FIG. 2B.

In metal layer (50) are a pair of conductors (60 and 62). Disposed between the conductors within the metal layer is a fill element (64). The fill element is connected to a ground contact (68) in the lower adjacent metal layer (54) by a via (66). The via passes through dielectric layer (58). It will be appreciated that the fill element could also be grounded to a contact in the upper adjacent metal (52). The ground contact may be a ground wire or a grounded fill element.

Figure 2C:
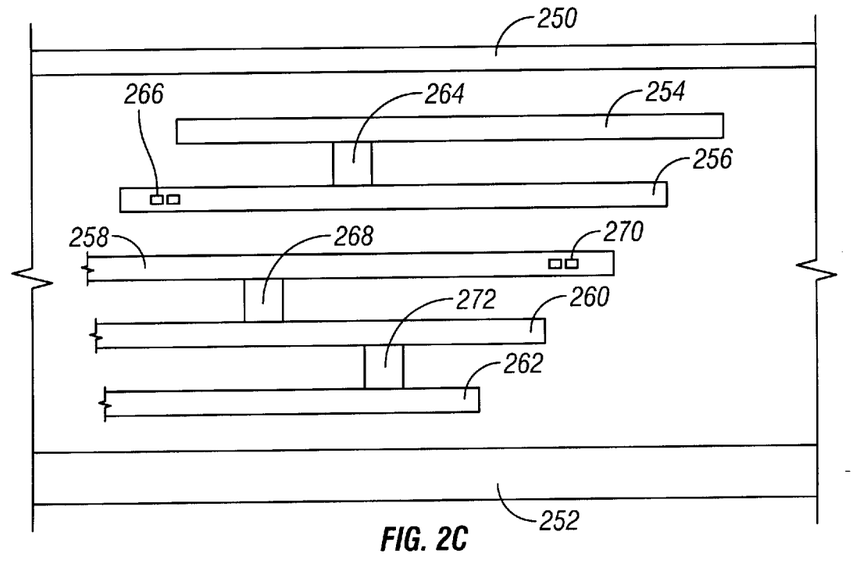
FIG. 2C is a diagram of a portion of a metal layer showing fill elements connected to ground areas in the same metal layer in accordance with an embodiment of the present invention.

FIG. 2C is a top view diagram of a portion of a metal layer showing fill elements connected to ground areas in a metal layer in accordance with an embodiment of the present invention. In the portion shown, there are two conductors 250, 252. Between the conductors are fill elements 254, 256, 258, 260, 262. Fill element 254 is connected to fill element 256 by strap 264. Fill element 256 is, in turn, connected to a ground area in an adjacent metal layer (not shown) by via 266. Fill element 260 is connected to fill element 258 by strap 268. Fill element 258 is, in turn, connected to a ground area in an adjacent metal layer (not shown) by via 270. Additionally, fill element 262 is connected to fill element 260 by strap 272.

Figure 3A:
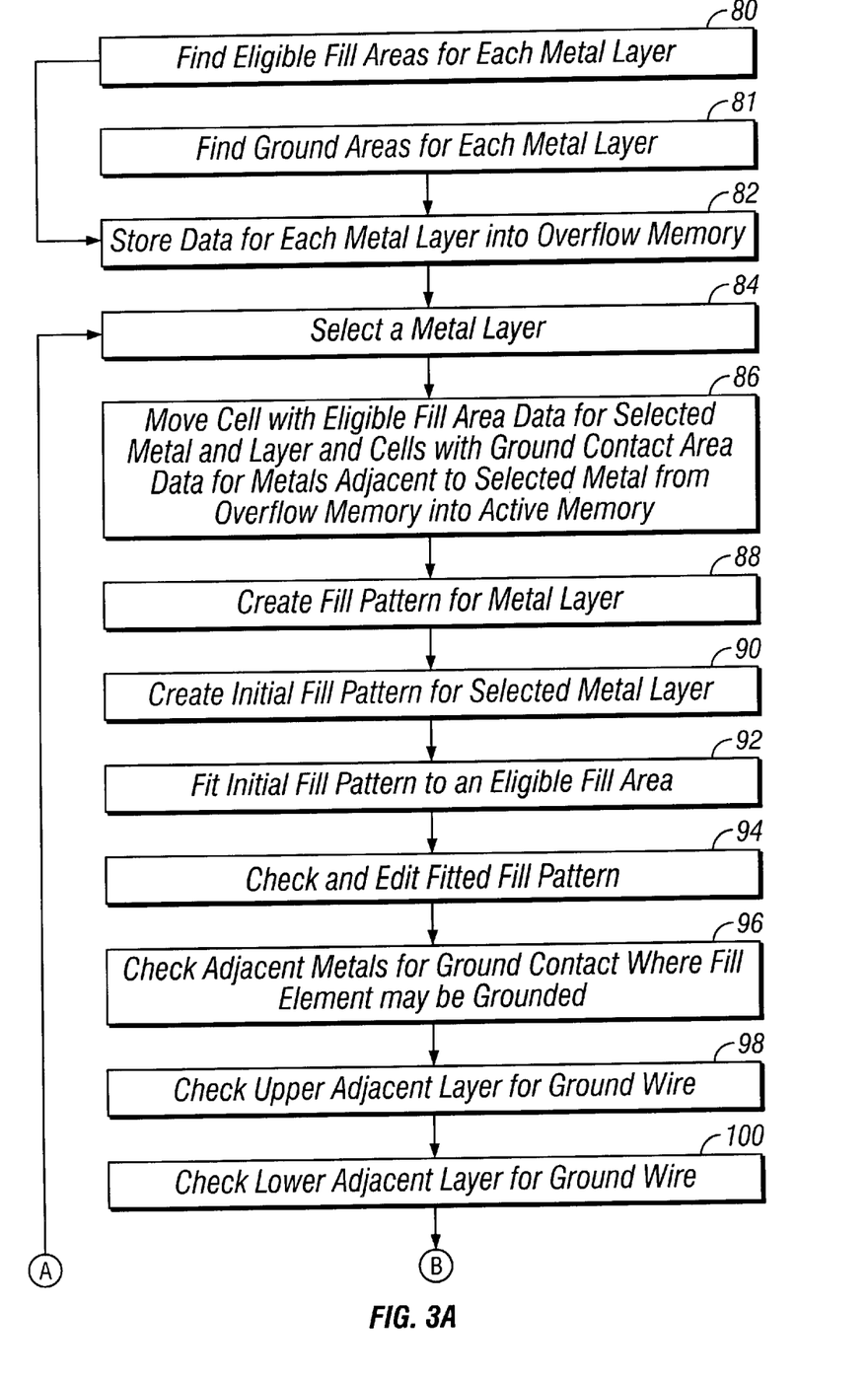
FIG. 3 is a process flow diagram showing the steps of incorporating grounded fill elements into the design of an integrated circuit chip having multiple metal layers in accordance with an embodiment of the present invention.
Figure 3B:
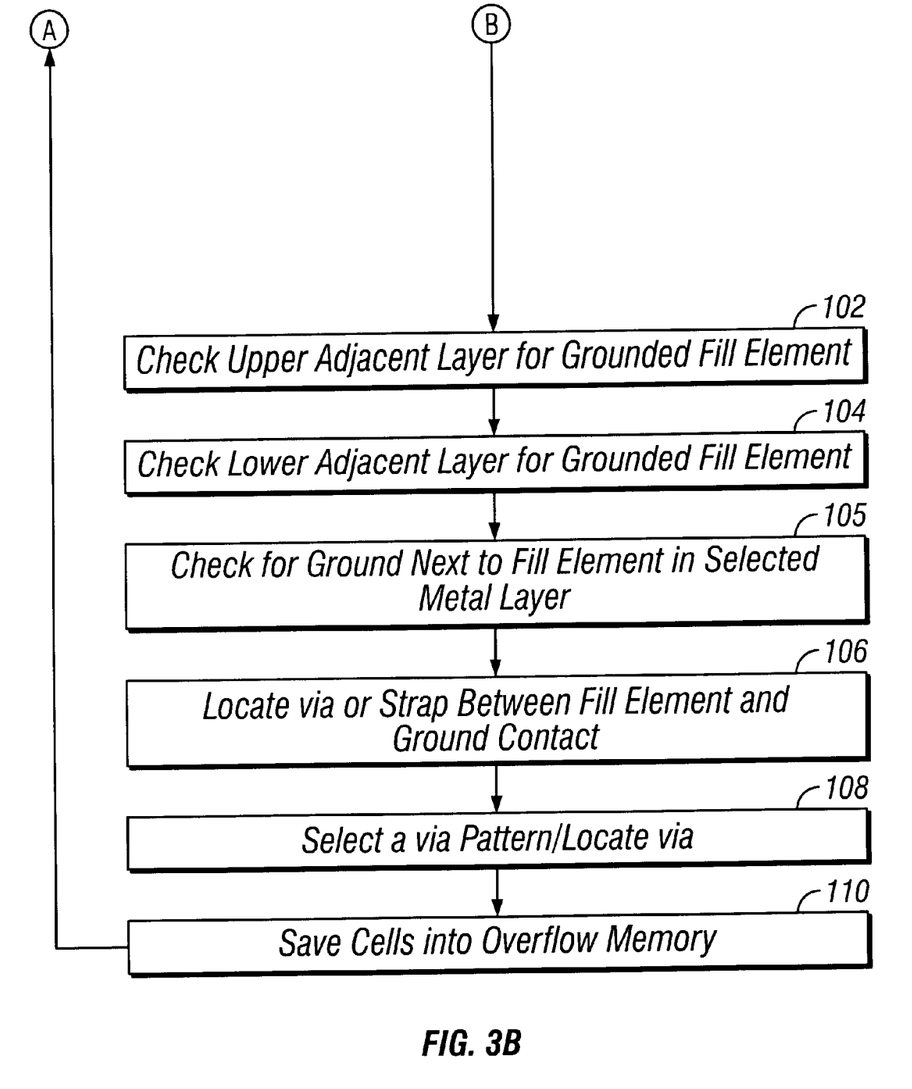

FIG. 3 is a process flow diagram showing the steps of incorporating grounded fill elements into the design of an integrated circuit chip having multiple metal layers in accordance with an embodiment of the present invention. The process generally requires a computer when designing large-scale chips. Further, the process may utilize commercially available CAD tools to expedite certain steps.

Since available CAD tools and computers have finite capabilities in terms of available active memory and processing speed, optimized use of resources is a major consideration. It is the complexity of large-scale integrated circuit chips which pushes the limitations of available tools. Complex chip designs typically include multiple metal layers, tens of millions of wired transistors, and require the locating of tens of thousands of grounded fill elements. Without the advantages of the present invention, the requirements of the design of grounded fill elements would quickly overwhelm existing systems.

The first steps involve identifying the eligible fill areas for each metal layer in which grounded fill elements are to be incorporated (80) and identifying ground areas in each metal layer (81). These steps may be accomplished by using a commercially available CAD tool, such as Dracula, available from Cadence, Inc. of San Jose, Calif. or Calibre, available from Mentor Graphics, Inc. of Wilsonville, Oreg. Each metal layer is processed in turn. Each data set, comprising either the fill areas for a metal layer or the ground areas for a metal layer, may be referred to as a cell. To conserve available memory, cells representing the eligible fill areas and ground areas for each metal layer are stored onto discs 82. Memory discs may be referred to as overflow memory. Overflow memory may also include other kinds of storage media containing data, which is not accessible to operating software without first loading the data into RAM or other active memory. The first steps are complete when the eligible fill areas and ground areas for all metal areas have been identified and stored as cells in overflow memory.

Once all the eligible fill areas have been identified, the metal layers are processed in turn. A metal layer is selected for processing (84). A cell representing the eligible fill areas for the selected layer is copied from the overflow memory to the active memory (86). A cell or cells representing available ground contacts in the adjacent layer or layers is also copied to active memory (86).

Once the needed data is in active memory, a fill pattern is created for the selected metal layer (88). The fill pattern is composed of a number of fill elements. For example, the fill pattern may comprise a plurality parallel stripes oriented in the same direction as most of the wires of the metal layer. The fill stripes are intentionally not aligned to make coverage better and to ensure that any capacitive effects from perpendicular wires in adjacent metal layers are uniform. Preferably, when stripes are used, the fill patterns on adjacent metals are oriented at right angles. Though parallel stripes are preferred, other shapes of fill elements may be used without departing from the invention.

Creating the final fill pattern involves several steps. First, an initial fill pattern is created (90). The initial fill pattern is a computer-generated template that is usually applied to the entire metal layer, though areas of the metal layer may specifically excluded from coverage. Next, the initial fill pattern is fitted to the eligible fill areas and the portions of the initial fill pattern that fall outside the eligible areas are deleted (92). Then the fitted fin pattern is checked and edited (94). Such editing may comprise deleting fill elements that violate design rules. Commercially available CAD tools are available to assist in creating the fill patterns. One such tool is Diva, available from Cadence, Inc. of San Jose, Calif.

It should be noted that the phrase "fill pattern" is used in several contexts throughout this disclosure. An "initial fill pattern" is a template created to apply to a selected metal layer. The initial fill pattern may cover virtually the entire metal layer. The initial fill pattern will be composed of a plurality of elements, preferably a plurality of parallel stripes. The initial fill pattern may have an orientation, e.g., the stripes will typically parallel the wires of the metal layer. The elements within the initial fill pattern will typically follow a specification. For example, a fill pattern with elements comprising parallel stripes may have specified distances between stripes, widths of stripes, and lengths of stripes. A "fitted fill pattern" is the result of applying the initial fill pattern to an eligible fill area or a plurality of eligible fill areas. The fitted fill pattern omits portions of the initial fill pattern outside the eligible fill area or areas. A "final fill pattern" or simply "fill pattern" is the result of excluding elements (or portions of elements) of the fitted fill pattern that violates metal fill rules specified by the chip designers. For example, elements of the fitted fill pattern which cannot be grounded may be omitted from the final fill pattern.

During creation of the final fill pattern, adjacent metals are checked for cross areas where the fill elements may be connected to ground (96). This process may be performed for every fill element in the fill pattern. Since upper metal layers are typically dimensioned larger than lower metal layers, the upper adjacent layer is preferably checked first. For a given fill element, the upper adjacent layer is checked for ground wires (98). If necessary, the lower adjacent layer is then checked for ground wires (100). The next preference is to check the upper adjacent layer for grounded fill elements (102). Next is to check the lower adjacent layer for grounded fill elements (104). Also, the same metal layer may be checked for areas to locate a grounding strap (106).

If no ground contact is available for a fill element, that information is stored. If a ground contact is available, a via or strap is located between the most preferable ground contact and the fill element (106). Again, this process must be performed for each individual fill element. In locating a via or strap, the designer has discretion to select the type of via (e.g., number of contacts) and the location of the via or strap within the cross area (108).

Once all the vias and straps have been located, the design for the metal layer includes the fill elements and the via and strap locations. This data for the selected metal layer is stored into the overflow memory, along with the data for the adjacent metal layers (110). Thus, active memory is then available for processing the next selected metal layer and steps 84–100 are repeated.

In the special cases of the lowest and topmost metal layers, each has only one adjacent metal layer. It will be appreciated that the above scheme will be easily applied to these special cases by slightly varying the scheme.

Figure 4:
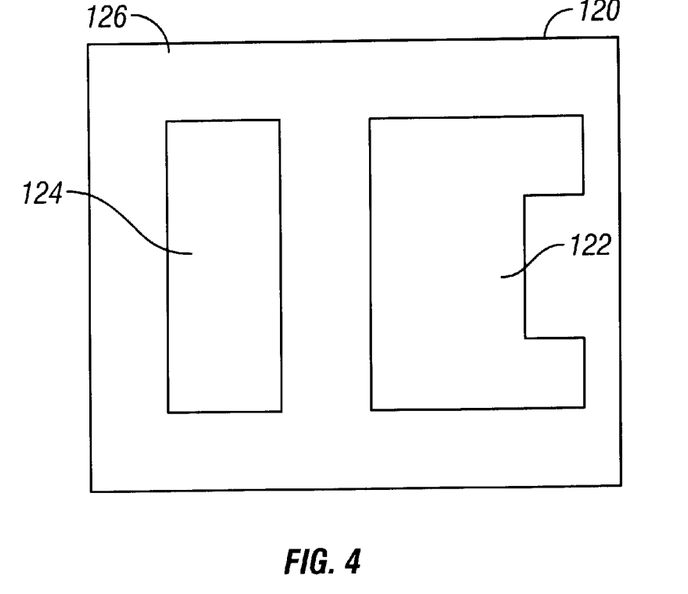
FIG. 4 is a diagram of a metal layer showing two eligible fill areas in accordance with the present invention.
Figure 5:
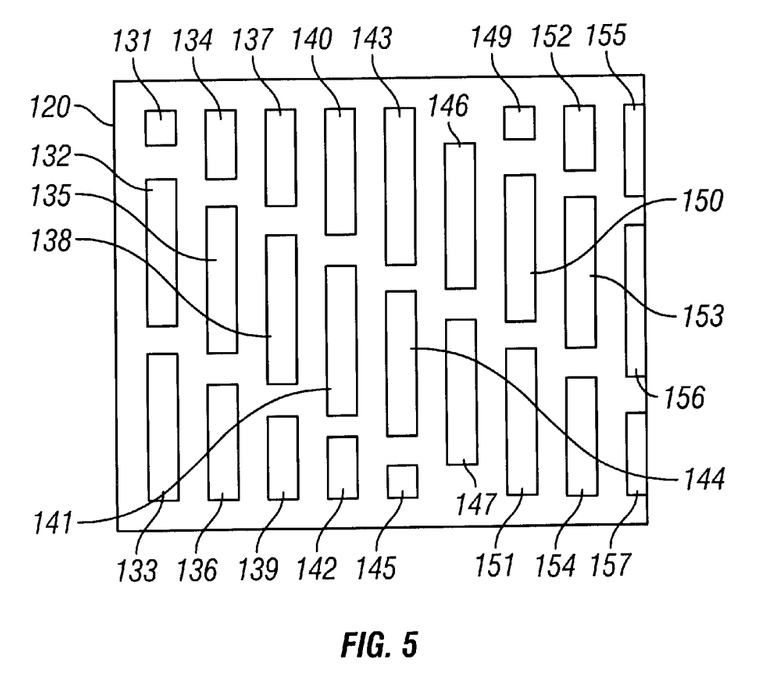
FIG. 5 is a diagram of an exemplary initial fill pattern in accordance with the present invention.
Figure 6:
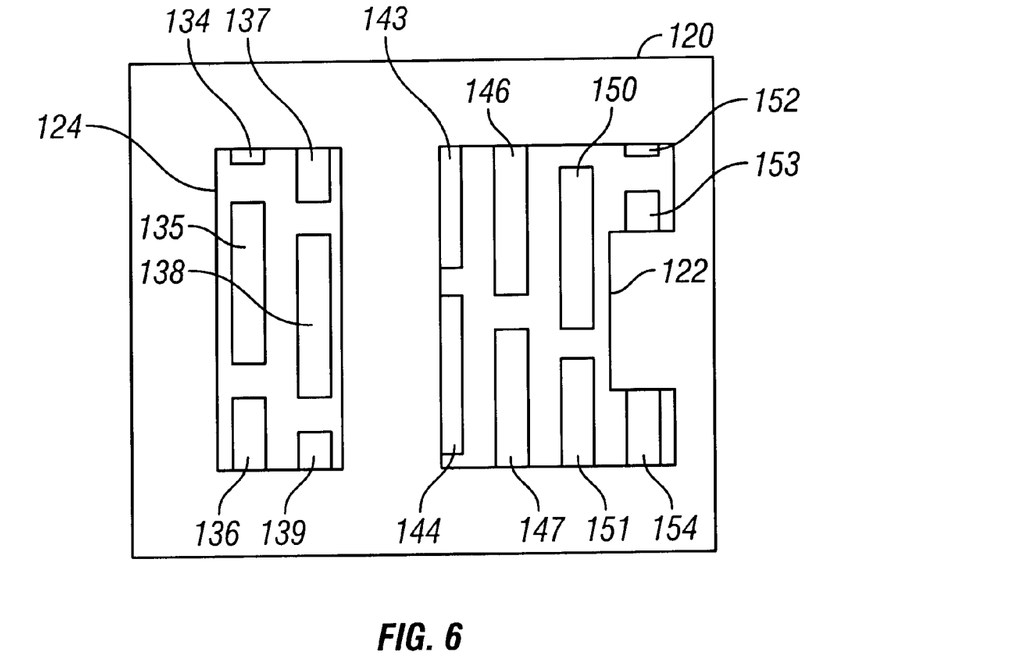
FIG. 6 is a diagram fitted fill pattern, illustrating the results of fitting the initial fill pattern to the eligible fill areas on a metal layer in accordance with an embodiment of the present invention.
Figure 7:
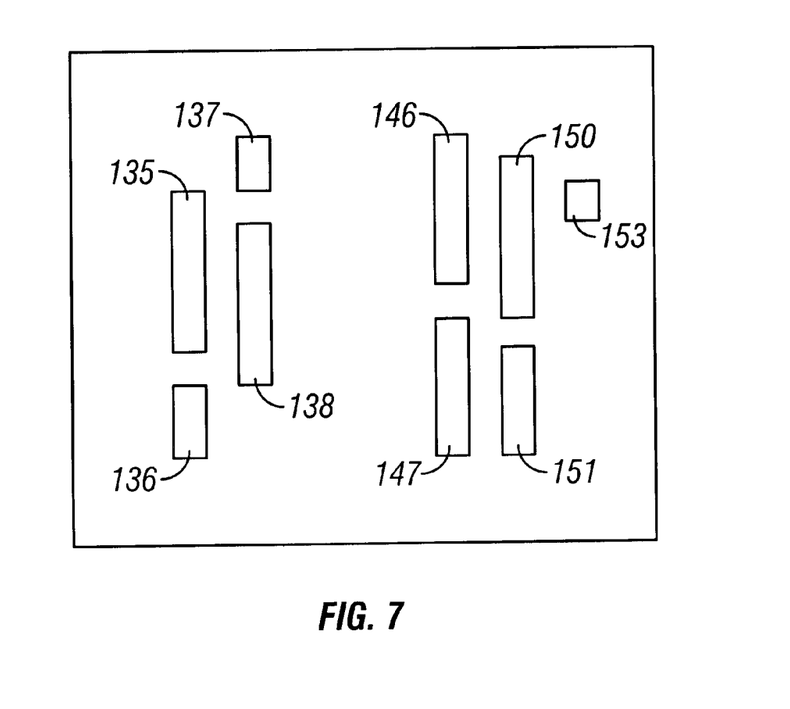
FIG. 7 is a diagram of a final fill pattern, illustrating the results of checking and editing the fill pattern in accordance with an embodiment of the present invention.

The described process and the results of the process are further illustrated in the following figures. FIG. 4 is a diagram of a metal layer showing two eligible fill areas in accordance with the present invention. FIG. 5 is a diagram of an exemplary initial fill pattern in accordance with the present invention. FIG. 6 is a diagram fitted fill pattern, illustrating the results of fitting the initial fill pattern to the eligible fill areas on a metal layer in accordance with an embodiment of the present invention. FIG. 7 is a diagram of a final fill pattern, illustrating the results of checking and editing the fill pattern in accordance with an embodiment of the present invention.

In FIGS. 4–7, the term metal layer (e.g., metal layer 120) is used to indicate a layout area which contains wires as well as potential fill areas.

Referring now to FIG. 4, a metal layer 120 is shown. The metal layer is comprised of deposited conductive material which is subsequently etched using processes well known in the art. After etching, much of the metal layer area is comprised of closely spaced wires. This area is shown at 126. There are two eligible fill areas (122 and 124) in the metal layer 120. The eligible fill areas are areas of a defined minimum size not containing a wire. This diagram does not show the correct scale or proportions. In practice, a metal layer typically has a number of relatively small eligible fill areas in a metal layer while most of the metal layer contains closely spaced wires.

During chip design, the wires are laid out in each metal layer. Once the wires have been laid out, the eligible fill areas in the metal layers may be determined. In a presently preferred embodiment, the metal areas are defined as areas of at least 2500 square microns not having a wire. However, dimensions may vary depending upon the technology used.

The location of fill elements within the eligible fill areas must be planned. In accordance with one aspect of the invention, a fill pattern is created for the metal layer. Until physical production of the chip, the fill pattern is a design stored in computer memory or on tape. FIG. 5 is a diagram of an exemplary initial fill pattern created by a computer. The initial fill pattern is created for metal layer 120. The initial fill pattern is comprised of a plurality of elements (131–147 and 149–157). The exemplified fill elements are called stripes, though fill elements may be of a variety of shapes. The fill elements are designed to minimize capacitive loading. Also, the size of the fill elements is limited so that vias and straps are not overloaded by ground current. In a presently preferred embodiment, the stripes are less than about 100 to 1000 microns long, about 1 to 10 microns wide, and are spaced about 2.0 to 5.0 microns apart.

Once the eligible fill areas and an initial fill pattern for a metal layer have been determined, the initial fill pattern is fitted to the eligible fill areas. FIG. 6 is a diagram illustrating the results of fitting the initial fill pattern to the eligible fill areas on a metal layer. Metal layer 120 having eligible fill areas 122 and 124 is shown. At this stage, the fill pattern includes fill elements 135, 138, and 150 and portions of fill elements 134, 136, 137, 139, 143, 144, 146, 147, 151, 152, 153 and 154, all of which coincide with the eligible fill areas in the metal layer. Fill elements and portions of fill elements from the initial fill pattern which lie outside the eligible fill areas have been deleted from the fitted fill pattern.

The next step is to check the fill pattern for compliance with design rules and edit the pattern accordingly. FIG. 7 is a diagram illustrating the results of checking and editing the fill pattern. Referring now to FIG. 7, the same metal layer 120 is exemplified as in FIGS. 4–6. The final edited fill pattern, consisting of fill elements 135, 136, 137, 138, 146, 147, 150, 151, and 153, is shown. Each of the fill elements in the final fill pattern of FIG. 7 is connected to ground by either a via or a strap (not shown). The wires of metal layer 120 are not shown. Referring between FIGS. 6 and 7, it is seen than several fill elements or portions of fill elements have been removed in the editing. For example, portions 144, 145, and 154 appear in the fitted fill pattern shown in FIG. 6, but not in the final fill pattern shown in FIG. 7.

Fill elements or portions of fill elements may been edited out so as not to be included in the final fill pattern for various reasons. One reason may be that the fill element has dimensions too small to be implemented in the design. For example, if fill element portions 144 and 145 were narrower than the enabling technology allowed, they would be edited out. Another reason that a fill element or fill element portion may be edited out is that no ground contact was found in an adjacent metal layer. During the editing, vias are located to connect the fill elements to ground. In some cases, no ground contact mat be available to ground a fill element. It may be desired that such ungrounded fill elements be removed from the final fill pattern. In one embodiment, the location of ungrounded fill elements are stored in a separate cell from the location of grounded fill elements when the data for a metal layer is stored back into overflow memory after completing design of a metal layer.

As mentioned, vias and straps are located during the editing step. The type and position of the vias are also determined at this time. Vias may each have one or more contacts between the elements (or element and ground wire) they are connecting. While the vias may by located anywhere in a cross area between elements to be connected, it is preferable that they be located away from the edges of the elements. Also, uniform localization may speed the design process.

Figure 8:
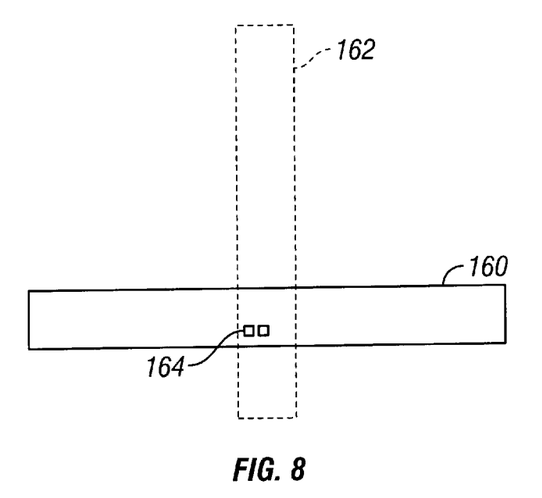
FIG. 8 is a diagram showing a via connecting two fill elements located in adjacent metal layers in accordance with an embodiment of the present invention.

FIG. 8 is a diagram showing a via connecting two fill elements located in adjacent metal layers in accordance with an embodiment of the present invention. Fill element 160 is located in a first metal layer. Fill element 162 is located in an adjacent metal layer. A via 164 is located to connect fill elements 160 and 162. As uniform localization may speed the design process, via 164 may be located in the lower left corner of the cross area defined by the intersection of the fill elements (160 and 162), for example. One of fill elements 160 or 162 must be connected to ground by a via or strap (not shown).

Figure 9:
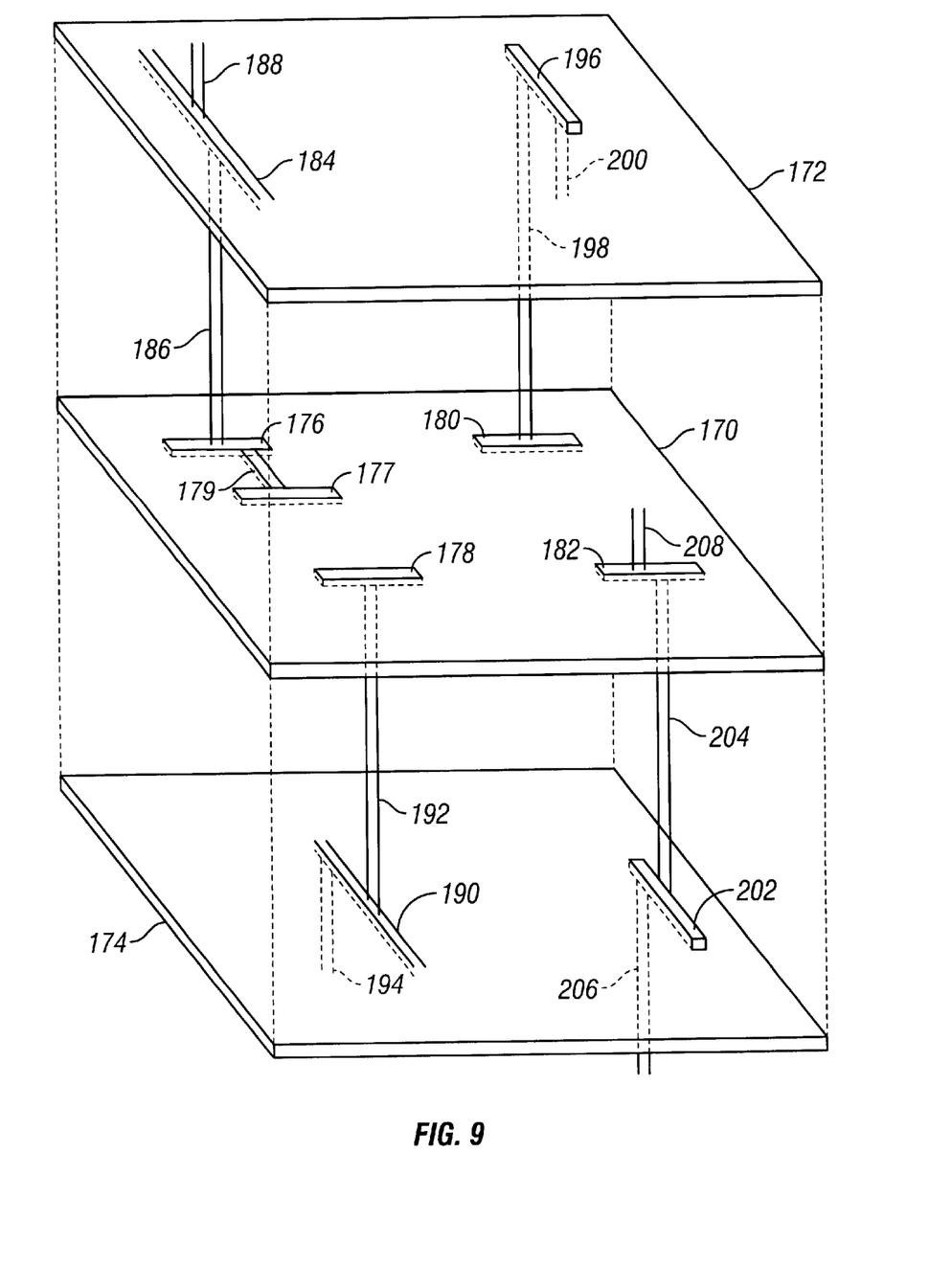
FIG. 9 is a perspective diagram showing various permutations of connecting grounded fill elements within three metal layers of a chip in accordance with an embodiment of the present invention.

FIG. 9 is a perspective diagram showing various permutations of connecting grounded fill elements within three metal layers of a chip in accordance with an embodiment of the present invention. A metal layer 170 is shown. There is an upper adjacent metal 172 and a lower adjacent metal 174. On metal layer 170, four fill elements (176, 178, 180, and 182) are shown. Metal layer 172 contains ground wire 184 and fill element 196. Metal layer 174 contains ground wire 190 and fill element 202. Fill element 176 is connected to ground wire 184 by via 186. Fill element 177 is connected to fill element 176 by strap 179. Ground wire 184 may also ground other fill elements, for example by connection with via 188. Fill element 178 is connected to ground wire 190 by via 192. As before, ground wire 190 may also ground other fill elements, for example by connection with via 194. Fill element 180 is connected to grounded fill element 196 by via 198. Grounded fill element 196 is in turn connected to another ground area by via 200. Fill element 182 is connected to grounded fill element 202 by via 204. Grounded fill element 202 is in turn connected to another ground area by via 206.

Any of the grounded fill elements (176, 177, 178, 180, 182) shown on metal 170 may be used as a ground contact to ground fill elements on adjacent metal layers. For example, via 208 may ground a fill element (not shown) on upper adjacent metal 172.

Fill elements are connected so that no loops are created. Thus, only one via or strap connects any one fill element to ground.

It will be appreciated that grounded fill elements, in conjunction with ground wires and vias, as shown in FIG. 9 will form a network within the integrated circuit. The presence of the fill metal by itself is beneficial during polishing of the metal layers. The grounded network is beneficial in reducing noise within the integrated circuit.

Figure 10:
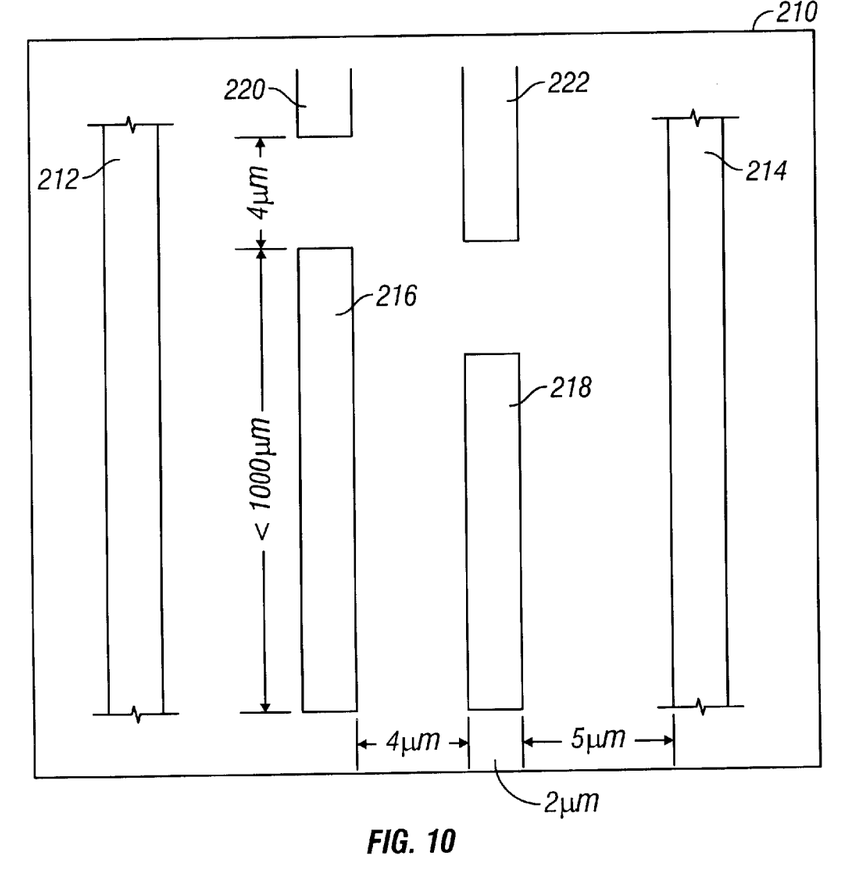
FIG. 10 is a diagram showing preferred dimensions relating to fill elements according to a embodiment of the present invention.

It is important to limit the size of grounded fill elements. If the grounded fill elements are too large, they will add undue capacitive loading to the integrated circuit. By limiting the size of the grounded fill elements, such loading effects can be minimized. FIG. 10 is a diagram showing preferred dimensions relating to fill elements according to a embodiment of the present invention. Metal layer 210 having wires 212 and 214 is shown. Two fill elements (216, 218) are also shown along with the ends of two additional fill elements (220, 222). In the preferred embodiment shown, the fill elements comprise stripes which are no greater than two microns wide and no greater than about 1000 microns long. For such sized stripes, the stripes are 4 microns apart, both side-to-side and end-to end and each stripe is at least 5 microns from any wire. It will be appreciated that the dimensions described may be varied in accordance with the invention.

Since it is expected that chip feature sizes will continue to become smaller, in one preferred embodiment there is a spacing of less than five microns between any two fill elements.

Figure 11:
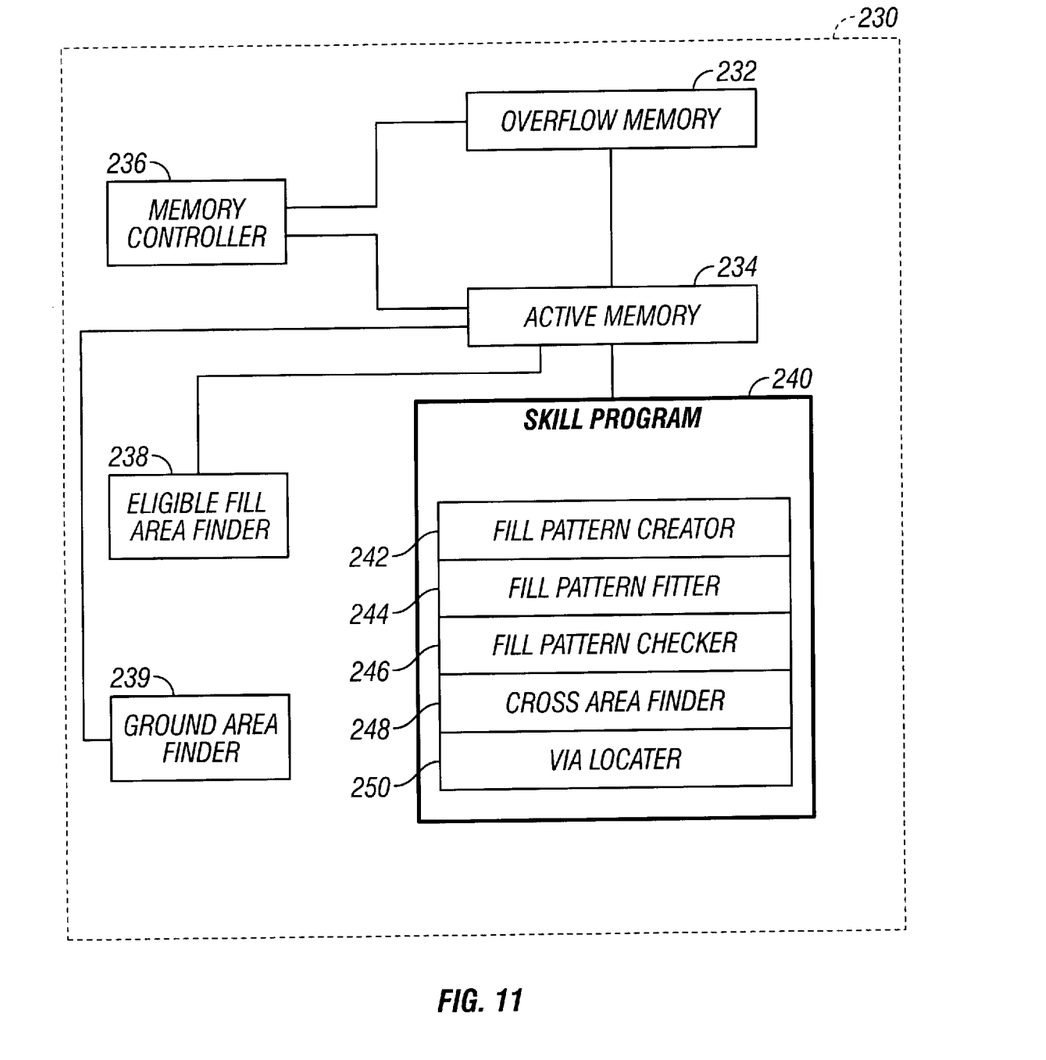
FIG. 11 is a block diagram showing the functional components of a CAD system for locating a fill element in a selected metal layer of an integrated circuit having multiple metal layers, and for locating a via connecting said fill element to a ground contact in an adjacent metal layer according to a presently preferred embodiment of the invention.

In order to accomplish the design of the present invention for a large scale integrated circuit, the proper CAD tools must be assembled. FIG. 11 is a block diagram showing the functional components of a CAD system for locating a fill element in a selected metal layer of an integrated circuit having multiple metal layers, and for locating a via connecting said fill element to a ground contact in an adjacent metal layer according to a presently preferred embodiment of the invention.

The CAD system 230 includes an overflow memory 232, which may consist of disc memory or other media storing that is not available to a central processing unit (CPU) without first loading the data into other memory. The overflow memory stores memory cells for each metal layer. A cell is a unit of data which can contain a whole design or a portion of a design. A cell may contain an instance of another cell. Data stored for each metal layer may include: location of conductors, location of ground wires, location of eligible fill areas, location of ungrounded fill elements, location of grounded fill elements, and location of vias and straps. It will be appreciated that the organization of data in the memory cells may vary within the scope of this invention. However, the data should be organized so as to allow the minimum amount of necessary data to be loaded into active memory at a time when it is needed, without loading the active memory with data which is not required at that time. For example, when attempting to locate vias to grounds areas in an adjacent metal layer, the active memory needs to contain the location of both ground wires and grounded fill elements in the adjacent area. The active memory does not need to contain the location of the conductive wires in the adjacent metal layer, though.

The CAD system 230 also includes an active memory 234, which is readily accessible by the CPU. The active memory contains only needed data at any particular time. Because the active memory 234 contains only essential data, designing grounded fill elements for a large-scale integrated circuit according to this invention may be accomplished in a reasonable amount of time. Without restricting the contents of the active memory to essential data, limitations of active memory size and CPU speed would render such designing impractical for at least two reasons. First, processing the amount of data and number of computations required to design grounded fill elements is only possible to accomplish in a reasonable amount of time using standard computers if only the minimum data set is used at any time. Extra data, at the minimum, extends run times for processing steps and, at the worst, makes processing steps impossible. Second, by restricting the contents of active memory to immediately necessary data, it is easy to periodically store processed data into overflow memory for later use. This can result in large time savings in the event of a program crash during a processing step.

As an example, before the determination of the eligible fill areas for a selected metal layer, the only data required to be in active memory is the location of the conductors and ground wires of the selected metal layer. After such determination, the data on the location of the conductors and ground wires of the selected metal layer is stored into overflow memory, as is the newly produced data on the eligible fill areas.

As another example, before running the skill program that designs grounded fill elements for a selected metal layer, the data in active memory comprises the eligible fill areas for the selected metal and the ground areas (ground wires and grounded fill elements) in the adjacent metal or metals. Again, after running the program the original data is stored into overflow memory as is the newly produced data.

A memory controller 236 controls the transfer of data between the overflow memory 232 and the active memory 234. The memory controller 236 may be computer code which automatically transfers data, a set of system commands to be controlled by an operator, or a combination of the two. The memory controller ensures that, at any time, the required data (and no more) is in active memory 234 while the rest of the design data is in overflow memory 232.

The CAD system 230 also comprises an eligible fill area finder 238. The eligible fill area finder 238 may be a commercially available computer program such as Dracula. The eligible fill area finder is capable of determining eligible fill areas on a metal layer having its conductors and other wires laid out. For each metal layer, the eligible fill area finder identifies the eligible fill areas and saves that data into a cell.

The CAD system 230 also comprises a ground area finder 239. The ground area finder identifies where ground wires are located in each metal layer, and stores that data into a cell.

The CAD system 230 further comprises a skill program 240 which, given eligible fill areas for a selected metal layer and ground areas in adjacent metals, will locate fill elements within the selected metal and vias grounding the fill elements.

The skill program 240, in turn, is comprised of several routines for performing the steps in locating and grounding fill elements. A fill pattern creator 242 creates an initial fill pattern for the selected metal layer. A fill pattern fitter 244 fits the initial fill pattern to the eligible fill areas. Commercially available programs such as DIVA, available from Cadence, may perform some of the functions of the fill pattern fitter 244. A cross area finder 248 attempts to find a cross area for each fill element and a ground areas on an adjacent metal layer. A via locator 250 locates a vias in the cross areas in order to ground the fill elements. A fill pattern checker 246 checks and edits the fill pattern. The fill pattern checker 246 may provide functions such as designating fill elements for which cross areas cannot be found and partitioning such fill elements in a memory cell separate form grounded fill elements, deleting fill elements or portions of fill elements from the final fill pattern, and ensuring that design rules are followed.

Together, the components of CAD system 230 allow an operator to design grounded fill elements into an integrated circuit. The input to the CAD system is the circuit design of the chip, including the design of each metal layer. The output is an augmented chip design including a network of grounded fill elements. No modification of the chip fabrication process is needed for chips having the augmented design. However, chips with the augmented design have superior performance because of reduced noise within the integrated circuit.

In one aspect, the invention comprises a method for designing grounded fill in an integrated circuit, where the integrated circuit has multiple metal layers. The method employs a computer-aided design (CAD) system having a fixed amount of memory. The method comprises:

(a) finding the eligible fill areas for each metal layer;
(b) storing the eligible fill area data for each metal layer in an overflow memory;
(c) finding ground contact areas for each metal layer;
(d) storing the ground contact area data for each metal layer in an overflow memory;
(e) temporarily storing the eligible fill area data for a selected metal layer and the ground contact area data for the metal layers adjacent to said selected metal layer in said fixed amount of memory;
(f) fitting a fill pattern to an eligible fill area in said selected metal layer, said fill pattern composed of at least one element;
(g) checking said adjacent metal layers for a ground contact where said element of the fill pattern may be grounded;
(h) locating a conductive via between said element of the fill pattern and a ground contact in an adjacent layer; and
(i) repeating steps (e) through (h) for each metal layer.

The method may further comprise saving data representing the element and the via locations in said overflow memory after step (h).

Preferably, an attempt to locate the via to a ground contact in the upper adjacent layer is made before attempting to locate the via to a ground contact in the lower adjacent layer.

The ground contact may be a ground wire or a grounded fill element.

The elements of the fill pattern may comprise parallel stripes. The ends of the parallel strips are preferably not aligned. The fill pattern may comprise less than 30% of the eligible fill area.

In another aspect, the invention comprises a computer aided design (CAD) system for locating a fill element in a selected metal layer of an integrated circuit having multiple metal layers. The CAD system is able to locate a via connecting the fill element to a ground contact in an adjacent metal layer. The CAD system comprises a fixed amount of active memory for storing a cell representing a fill pattern for said selected metal layer and for storing cells representing ground contact areas in the metal layers adjacent to said selected metal layer. The system also comprises an overflow memory for storing cells not stored in said fixed amount of memory. Such a system optimizes usage of active memory and allows the designing of fill elements into a large-scale integrated circuit.

The CAD system may further comprising an eligible fill area finder and a ground area finder.

Other components of the CAD system may include a fill pattern creator, where the fill pattern creator creates an initial fill pattern for said selected metal layer; a fill pattern fitter, where the fill pattern fitter creates a fitted fill pattern by fitting said initial fill pattern to an eligible fill area, where the fitted fill pattern comprises at least one element; a cross area finder, where the cross area finder finds a cross area between said fill element and a ground contact in an adjacent metal layer; and a via locator, where the via locator locates a via between the fill element and the ground contact.

The CAD system may further comprise a fill pattern checker, where fill pattern checker checks and edits the fitted fill pattern.

The CAD system may further comprise a memory controller, where the memory controller moves cells between the fixed amount of memory and the overflow memory.

In another aspect, the invention comprises a method for designing a grounded fill element in an integrated circuit where the integrated circuit has multiple metal layers. The method employs a computer-aided design (CAD) system having a fixed amount of memory. The method comprises:

(a) finding an eligible fill area in a selected metal layer;
(b) fitting a fill pattern to said eligible fill area, said fill pattern composed of at least one element;
(c) checking adjacent metal layers for a ground contact where said element of the fill pattern may be grounded; and
(d) locating a conductive via between said element of the fill pattern and a ground contact in an adjacent layer.

The method may further comprising repeating steps (a) through (d) for each metal layer.

In another aspect, the invention comprises a method for designing grounded fill in an integrated circuit where the integrated circuit has multiple metal layers. The method employs a computer-aided design (CAD) system having a fixed amount of memory. The method comprises:

(a) finding the eligible fill areas in each metal layer;
(b) storing the eligible fill area data for each metal layer in an overflow memory;
(c) finding ground contact areas in each metal layer;
(d) storing the ground contact area data for each metal layer in an overflow memory;
(e) temporarily storing the eligible fill area data and the ground contact area data for a selected metal layer in said fixed amount of memory;
(f) fitting a fill pattern to an eligible fill area in said selected metal layer, said fill pattern composed of at least one element;
(g) checking said ground contact area data for a ground contact where said element of the fill pattern may be grounded; and
(h) locating a conductive strap between said element of the fill pattern and a ground contact in said metal layer.

The method may further comprise repeating steps (e) through (h) for each metal layer.

In another aspect, the invention comprises an integrated circuit having a plurality of metal layers separated by a plurality of insulating layers. The integrated circuit comprises a pair of conductors on a first metal layer; at least one conductive fill element disposed between the conductors; and a via connecting said the fill element to a ground contact on a metal layer adjacent to the first metal layer. The via is formed of a conductive material.

It should be noted that grounded fill elements may be used without always having them disposed between two conductors on a metal layer. For example, it may be useful to locate a grounded fill element on the perimeter of a chip without having a conductor closer to the perimeter.

In the integrated circuit, the fill element may comprise a first stripe. The ground contact may comprise a second stripe, where the second stripe is oriented perpendicularly to the first stripe.

Fill elements may be included in all regions of the metal layers exceeding 2500 square microns not having a conductor or a ground wire.

Vias may be composed of a metal selected from the group consisting of copper, aluminum alloy or tungsten.

If the integrated circuit is comprised of at least two fill elements, there may be a spacing of less than five microns between the two fill elements.

Preferably, the stripes are less than two microns wide and less than about 1000 microns in length.

In another aspect, the invention comprises a method for designing a fill element in an integrated circuit where the integrated circuit has multiple metal layers. The method comprises finding an eligible fill area in a metal layer of the integrated circuit; fitting a fill pattern to the eligible fill area, where the fill pattern is composed of at least one element; checking adjacent metal layers for a ground contact where the element of the fill pattern may be grounded; and locating a conductive via connecting the element of the fill pattern and the ground contact in an adjacent layer.

Preferably, an attempt to locate the via to a ground contact in the upper adjacent layer is made before attempting to locate the via to a ground contact in the lower adjacent layer.

The ground contact may a ground wire or a grounded fill element.

The elements of the fill pattern may comprise parallel stripes and the fill pattern may comprise less than 30% of the eligible fill area.

In another aspect, the invention comprises a program storage device readable by a machine. The device tangibly embodies a program of instructions readable by the machine to perform a method for designing a fill element in an integrated circuit, where the integrated circuit has multiple metal layers. The method comprises:

finding an eligible fill area in a metal layer of the integrated circuit;
fitting a fill pattern to the eligible fill area, said fill pattern composed of at least one element;
checking adjacent metal layers for a ground contact where the element of the fill pattern may be grounded; and
locating a conductive via between the element of the fill pattern and a ground contact in an adjacent layer.

In another aspect, the invention comprises an integrated circuit having a plurality of metal layers separated by a plurality of insulating layers. The integrated circuit comprises a pair of conductors on a first metal layer; at least two conductive fill elements disposed between the conductors; and a strap between said two conductive fill elements, said strap formed of a conductive material.

It should be noted that the figures herein are for illustrative purposes, are not necessarily drawn to scale. When dimension or spatial orientation is critical, it is so noted in the written description.

It should also be noted that, while fill elements may sometimes be referred to as "fill metal," the present invention may potentially be employed with materials other than metals. For example, if technologies eventually allow, grounded fill elements may be composed of conductive plastics or other conductive materials.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An integrated circuit having a substrate upon which is disposed a plurality of metal layers separated by a plurality of insulating layers, the integrated circuit comprising:

a ground contact on a first metal layer of the plurality of metal layers;
a pair of conductors on a second metal layer of the plurality of metal layers, wherein said second metal layer is disposed between said first metal layer and the substrate;
at least two conductive fill elements disposed between said pair of conductors;

a strap connecting said at least two conductive fill elements to one another, wherein said strap is formed of a conductive material; and a via connecting one of said at least two conductive fill elements to said ground contact, wherein said via is formed of a conductive material.

2. The integrated circuit of claim 1, wherein said at least two conductive fill elements are disposed in a fill area between the conductors, the fill area otherwise not including a wire.

3. The integrated circuit of claim 2, wherein said conductive fill elements have a fill pattern including parallel strips.

4. The integrated circuit of claim 2, wherein said conductive fill elements have a fill pattern minimizing capacitive loading.

5. The integrated circuit of claim 2, wherein said conductive fill elements are formed on less than 30% of the fill area.

6. The integrated circuit of claim 1, further comprising:

a pair of conductors on a third metal layer of the plurality of metal layers, wherein said third metal layer is disposed between said second metal layer and the substrate;

at least a third conductive fill element disposed between said pair of conductors on said third metal layer; and a via connecting said at least a third conductive fill element to one of said at least two conductive fill elements, wherein said via is formed of a conductive material.

7. The integrated circuit of claim 1, further comprising:

a pair of conductors on a third metal layer of the plurality of metal layers, wherein said third metal layer is disposed between said second metal layer and the substrate;

at least a third and a fourth conductive fill elements disposed between said pair of conductors on said third metal layer;

a strap connecting said at least a third and a fourth conductive fill elements to one another, wherein said strap is formed of a conductive material; and a via connecting one of said at least a third and a fourth conductive fill elements to one of said at least two conductive fill elements, wherein said via is formed of a conductive material.

8. An integrated circuit having a substrate upon which is disposed a plurality of metal layers separated by a plurality of insulating layers, the integrated circuit comprising:

a ground contact on a first metal layer of the plurality of metal layers;

a pair of conductors on a second metal layer of the plurality of metal layers, wherein said second metal layer is disposed between said first metal layer and the substrate;

at least a first conductive fill element disposed in a fill area between said pair of conductors on said second metal layer;

a via connecting said at least a first conductive fill element to said ground contact, wherein said via is formed of a conductive material;

a pair of conductors on a third metal layer of the plurality of metal layers, wherein said third metal layer is disposed between said second metal layer and the substrate;

at least a second and a third conductive fill elements disposed between said pair of conductors on said third metal layer;

a strap connecting said at least a second and a third conductive fill elements to one another, wherein said strap is formed of a conductive material; and a via connecting one of said at least a second and a third conductive fill elements to said at least a first conductive fill element, wherein said via is formed of a conductive material.

9. The integrated circuit of claim 8, wherein said at least a first conductive fill element comprises a first stripe.

10. The integrated circuit of claim 9, wherein said ground contact comprises a second stripe, said second stripe oriented perpendicularly to said first stripe.

11. The integrated circuit of claim 8, wherein conductive fill elements are included in all regions of the metal layers exceeding 2500 square microns not having a conductor or a ground wire.

12. The integrated circuit of claim 8, wherein the via is composed of a metal selected from the group consisting of copper, aluminum alloy, and tungsten.

13. The integrated circuit of claim 8, further comprising at least a second conductive fill element disposed in said fill area between said pair of conductors on said second metal layer, wherein the spacing between the two conductive fill elements is less than about five microns.

14. The integrated circuit of claim 9, wherein said strip is less than two microns wide and less than about 1000 microns in length.

15. The integrated circuit of claim 8, further comprising a plurality of conductive fill elements disposed in said fill area between said pair of conductors on said second metal layer.

16. The integrated circuit of claim 15, wherein said conductive fill elements have a fill pattern including parallel strips.

17. The integrated circuit of claim 15, wherein said conductive fill elements have a fill pattern minimizing capacitive loading.

18. The integrated circuit of claim 15, wherein said conductive fill elements are formed on less than 30% of the fill area.

* * * * *

UNITED STATES PATENT AND TRADEMARK OFFICE
CERTIFICATE OF CORRECTION

PATENT NO. : 6,608,335 B2 Page 1 of 1
DATED : August 19, 2003
INVENTOR(S) : Punkaj Dixit et al.

It is certified that error appears in the above-identified patent and that said Letters Patent is hereby corrected as shown below:

Column 4,
Line 46, replace "fin" with -- fill --.

Signed and Sealed this

Thirtieth Day of December, 2003

JAMES E. ROGAN
*Director of the United States Patent and Trademark Office*